(12) United States Patent
Hesen et al.

(10) Patent No.: US 8,513,997 B2
(45) Date of Patent: Aug. 20, 2013

(54) RF DUTY CYCLE CORRECTION CIRCUIT

(75) Inventors: Leonardus Hesen, Hegelson (NL); Johannes Antonius Frambach, Nijmegen (NL); Paul Mateman, Millingen Aan de Rijn (NL)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/219,982

(22) Filed: Aug. 29, 2011

(65) Prior Publication Data

US 2012/0081163 A1 Apr. 5, 2012

Related U.S. Application Data

(60) Provisional application No. 61/388,083, filed on Sep. 30, 2010.

(51) Int. Cl.
*H03K 3/017* (2006.01)

(52) U.S. Cl.
USPC .......................................... 327/175; 327/172

(58) Field of Classification Search
None
See application file for complete search history.

(56) References Cited

U.S. PATENT DOCUMENTS

| | | | |
|---|---|---|---|
| 5,453,704 A | 9/1995 | Kawashima | |
| 5,491,441 A * | 2/1996 | Goetschel et al. | 327/291 |
| 6,583,657 B1 | 6/2003 | Eckhardt et al. | |
| 6,982,581 B2 | 1/2006 | Dosho et al. | |
| 7,456,667 B2 * | 11/2008 | Taylor et al. | 327/175 |
| 7,495,491 B2 | 2/2009 | Wu | |
| 2002/0075087 A1 | 6/2002 | Talbot | |
| 2008/0143408 A1 * | 6/2008 | Paillet et al. | 327/175 |
| 2008/0150600 A1 | 6/2008 | Taylor | |
| 2008/0231335 A1 | 9/2008 | Werking | |
| 2010/0167678 A1 | 7/2010 | Yoshikawa | |
| 2010/0284489 A1 | 11/2010 | Bae et al. | |

OTHER PUBLICATIONS

M. Shoji. CMOS Digital Circuit Technology. Chapter 3.3, p. 117 and Chapter 8.9 pp. 369-370, ISBN 0-13-138843-6. Prentice-Hall International Editions.

* cited by examiner

*Primary Examiner* — Cassandra Cox

(74) *Attorney, Agent, or Firm* — Coats & Bennett, P.L.L.C.

(57) ABSTRACT

A duty-cycle correction circuit comprises a plurality of AC-coupled, independently-biased inverter stages connected in series. A periodic signal is applied to an input of the plurality of inverter stages. Each inverter stage comprises an inverter with a resistive element connected in feedback between its output and input nodes. Each inverter stage is AC-coupled to a prior stage via a capacitor. The AC-coupling allows the signal to pass between inverter stages, but DC-isolates each inverter stage from adjacent stages, allowing each stage to maintain an independent DC bias of the signal at that stage. By virtue of the feedback resistive element, each stage defines a transition point between high and low signal states. Due to non-zero rise and fall times of the periodic signal, the independent DC bias of each stage is operative to incrementally shift the transition point of the periodic signal at each stage towards a desired duty-cycle.

26 Claims, 13 Drawing Sheets

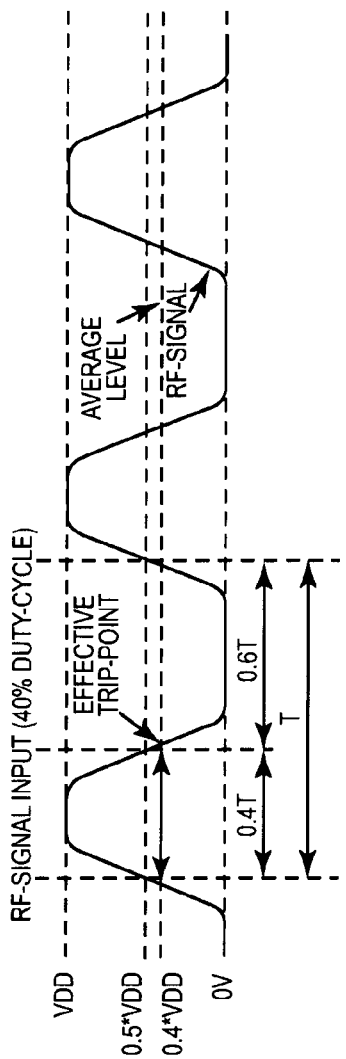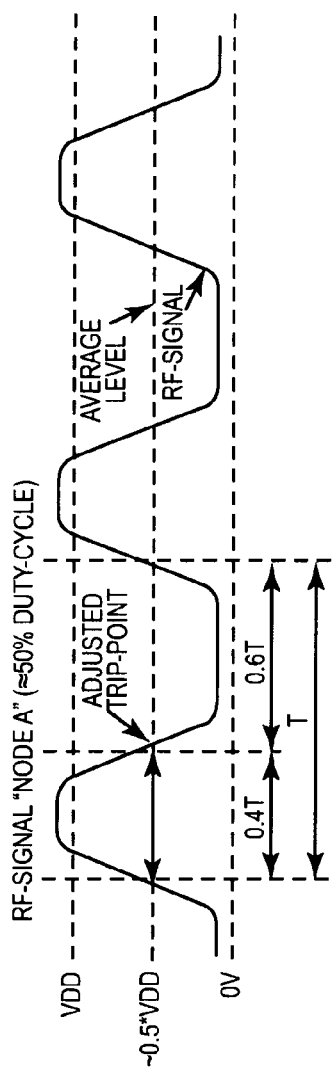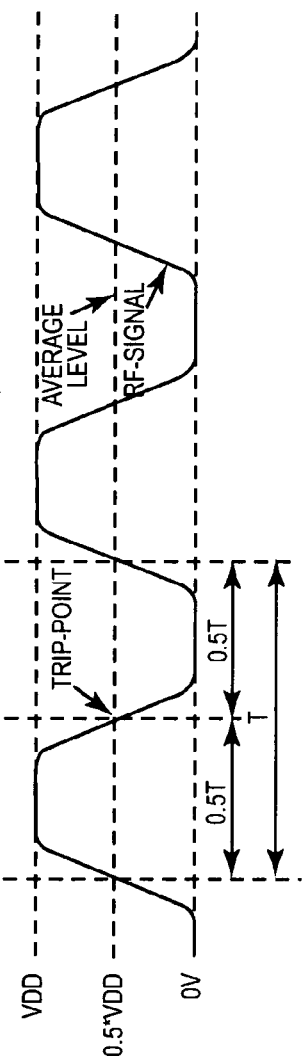

RF DUTY CYCLE CORRECTION CIRCUIT

This application claims priority to U.S. Provisional Patent Application Ser. No. 61/388,083, titled, "RF Duty-Cycle Correction Circuit," filed Sep. 30, 2010, the disclosure of which is incorporated herein by reference in its entirety.

TECHNICAL FIELD

The present invention relates generally to RF circuits, and in particular to an improved RF duty-cycle correction circuit design.

BACKGROUND

Periodic signals, also known as clock signals, are well known and widely utilized in both digital and analog circuits for a variety of functions. Periodic signals may be derived from a component generating a reference signal, such as a crystal oscillator, from a variable circuit such as a Voltage Controlled Oscillator (VCO), and from other sources. In many cases, particularly in Radio Frequency (RF) circuits, it is advantageous, if not critical, for such periodic cycles to have a carefully controlled and maintained duty-cycle. The duty-cycle for a periodic signal is an indication of the amount of a period that the signal is in one state or phase (e.g., high) vs. the other state or phase (e.g., low). For example, a 75% duty-cycle periodic signal is high for 75% of the period, and low for only 25% of the period.

One important and very common subset of periodic signals are those having a 50% duty-cycle. That is, for substantially half of the period, such a signal should be at a high level or state (i.e., above a predetermined transition voltage, such as midway between its peak-to-peak voltage swing), and for substantially half of the period, the signal should be at a low level or state. The 50% duty-cycle is common for clock signals in digital circuits. Among other factors, a 50% duty-cycle ensures that circuit logic and other components imposing a propagation delay have equal time to process signals in both phases, or states, of the periodic signal.

In some applications, a precisely-controlled, but non-50%, duty-cycle is desirable. Examples include LO signals for harmonic mixers, and mixers with lower second-order distortion. In these applications, a non-50%, duty-cycle periodic signal may vary from an initial duty-cycle In real-world designs, periodic signals vary from a their initial duty-cycle (whether 50% or some other duty-cycle value) for a variety of reasons.

One source of duty-cycle skew in 50% duty-cycle periodic signals is a fractional divider, also referred to as a fractional-N clock divider, which is utilized extensively in communication systems. A fractional divider divides a periodic RF signal by a non-integer division ratio, generating a new periodic signal having a lower frequency and a non-50% duty-cycle.

Other sources of duty-cycle skew, affecting all periodic signals, include clock signal amplification and distribution circuits. For example, many RF circuit components exhibit different propagation delays for high and low signal phases or transitions, and such imbalances may add to alter the overall duty-cycle of a periodic RF signal. Accordingly, the duty-cycle of a periodic signal may need to be corrected to bring it closer to a desired duty-cycle.

Duty-cycle correction circuits are known in the art, particularly for correcting 50% duty-cycle signals. In most cases, prior art circuits used for correcting duty-cycle perform three functions. First, the non-symmetrical (i.e., non-50% duty-cycle) periodic signal is delayed. Second, a mathematical (i.e., logical) expression (e.g., AND/OR) is applied between the non-symmetrical periodic signal and the delayed signal. Third, a correction is applied to one signal or the other, or both, to construct a new periodic signal having an accurate 50% duty-cycle. The correction can be made with a feedback loop or a calibration algorithm.

Such prior art duty-cycle correction circuits exhibit a number of deficiencies. They are electronically noisy, because the newly constructed signal is built, at least partly, from a delayed periodic signal. By delaying the rise and fall times, the signal uncertainty increases, which increases the phase noise. The prior art circuits are also sensitive to process spread and environmental changes, such as temperature variation.

Many RF functions are implemented using a balanced circuit architecture, in which positive and negative components of a signal are processed in complimentary, or mirrored, circuit components. Balanced circuits inherently reject common-mode noise. However, the common-mode noise rejection of balanced circuits depends on closely matching complementary circuit components. It is difficult to build a fully balanced duty-cycle correction circuit according to prior art techniques, so that the corrected signal(s) have a proper balancing and accurate duty-cycle.

Finally, prior art duty-cycle correction methods require extra circuits, and hence silicon real estate, (e.g., in a feedback loop or for calibration). This not only leads to larger integrated circuits, but also increases power consumption. Many modern RF devices are portable and operate on batteries, and hence reducing power consumption is an important design goal.

SUMMARY

According to one or more embodiments described and claimed herein, a duty-cycle correction circuit comprises a plurality of AC-coupled, independently-biased inverter stages connected in series. A periodic signal is applied to an input of the plurality of inverter stages. Each inverter stage comprises an inverter with a resistive element connected in feedback between its input and output nodes. Each inverter stage is AC-coupled to a prior stage via a capacitor. The AC-coupling allows the signal to pass between inverter stages, but DC-isolates each inverter stage from adjacent stages, allowing each inverter stage to maintain a separate, or independent, DC bias of the signal at that stage. By virtue of the feedback resistive element, each stage defines a transition point between high and low signal states. In combination with the real-world, non-zero rise and fall times of the periodic signal, the independent DC bias of each stage is operative to incrementally shift the transition point of the periodic signal at each stage towards a desired duty-cycle. By adjusting the number of AC-coupled, independently-biased inverter stages in the duty-cycle correction circuit, the duty-cycle of a periodic signal of arbitrary duty-cycle may be corrected to have a duty-cycle arbitrarily close to a desired value. In one embodiment, the independently-inverter stages are self-biased, correcting a periodic signal to a substantially 50% duty-cycle.

One embodiment relates to an duty-cycle correction circuit. The circuit includes a first plurality of AC-coupled, independently-biased inverter stages connected in series between an input operative to receive a periodic signal, and an output operative to generate a periodic signal having a duty-cycle dependent on the bias of the inverter stages. Each AC-coupled, independently-biased inverter stage includes an inverter having input and output nodes; an AC coupling component connected in series between the stage input and the input node of the inverter; and a resistive element connected between the input and output nodes of the inverter.

Another embodiment relates to a method of correcting the duty-cycle of a periodic signal. A periodic signal is accepted. The signal is successively inverted in a plurality of AC-coupled inverter stages, each independently biased to adjust the DC voltage level of the signal such that its transition point is incrementally closer to a predetermined fraction of a signal period. A periodic signal is output, the signal having a duty-cycle dependent on the bias of the inverter stages.

BRIEF DESCRIPTION OF THE DRAWINGS

FIG. 4 is a waveform diagram depicting the duty-cycle correction operation of the circuit of FIG. 1.

DETAILED DESCRIPTION

Figure 1:
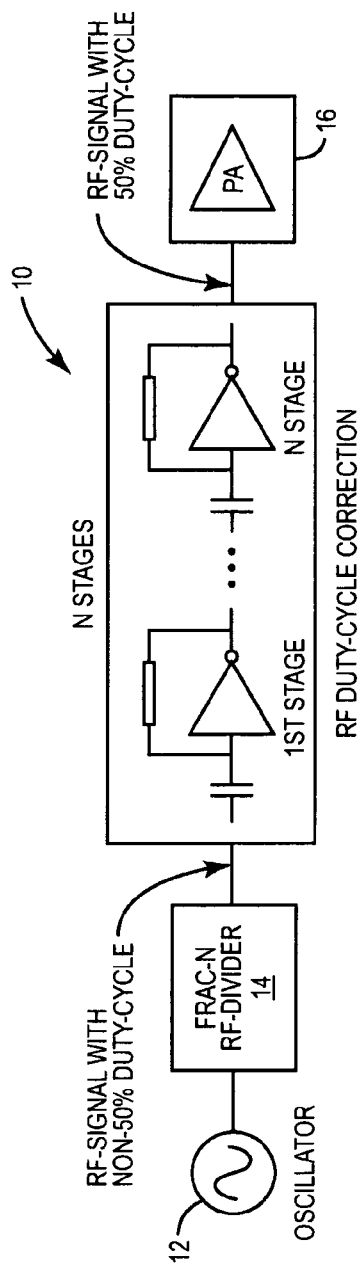
FIG. 1 is a functional schematic diagram of a duty-cycle correction circuit according to one embodiment of the present invention.

FIG. 1 depicts a duty-cycle correction circuit 10, according to one embodiment of the present invention, in a representative application requiring duty-cycle correction of a periodic signal. In some embodiments, the periodic signal is a Radio Frequency (RF) signal. In this example, a high frequency oscillator 12 outputs a periodic signal having an initial 50% duty-cycle, which is divided by a fractional-N RF-divider 14 (e.g., N=1.5, 2.5, etc.). The divided periodic RF signal will have a constructed duty-cycle that is no longer 50%. The RF duty-cycle correction circuit 10 automatically corrects the periodic RF signal to have an accurate 50% duty cycle. After the correction, further signal processing can be more accurately performed. In this example, a power amplifier (PA) 16 is used for further amplification of the RF signal.

Application of embodiments of the present invention is not limited to fractional-N dividers, or to correction of duty-cycle to a 50% value. The basic operating principles of the present invention are initially described herein with reference to embodiments correcting periodic signals (both single-ended and differential) to a substantially 50% duty-cycle. Embodiments correcting periodic signals to duty-cycles other than 50% are then described.

Figure 2:
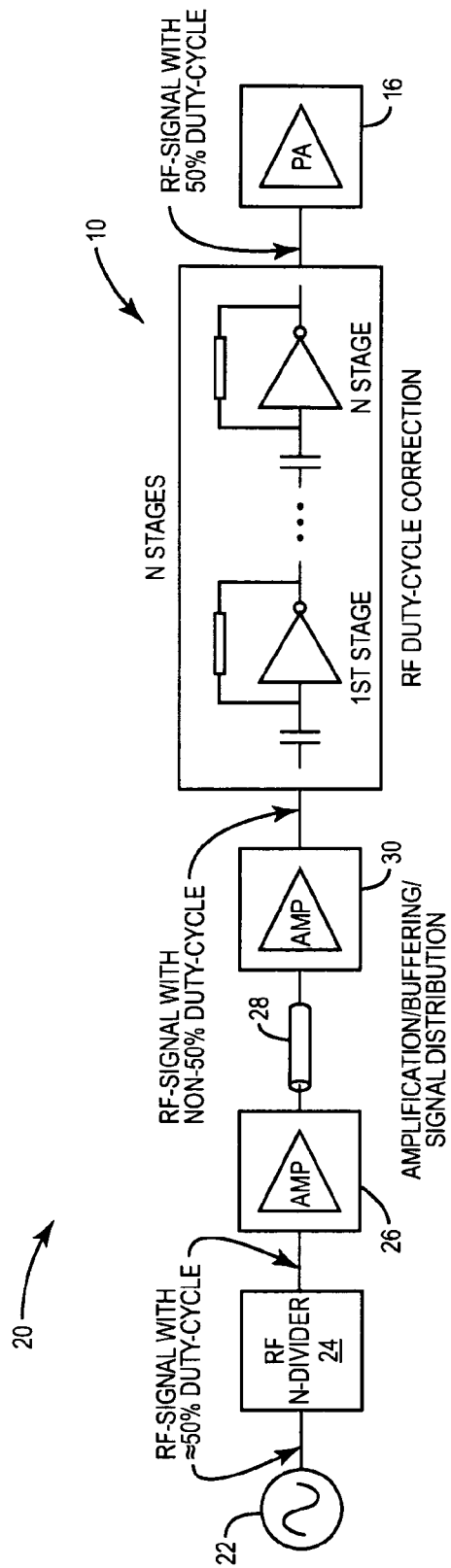
FIG. 2 is a functional schematic diagram depicting the use of an inventive duty-cycle correction circuit in a circuit having signals with duty-cycle errors.

FIG. 2 depicts a practical application 20, in which correction of the duty-cycle of a periodic RF signal is required. In this example, an oscillator 22 generates a periodic RF signal, which may have a substantially 50% duty-cycle. The periodic signal is divided by a non-fractional RF divider 24, yielding a periodic RF signal having a lower frequency, but still a substantially 50% duty-cycle. This signal is amplified by an amplifier 26, and in general may experience extensive amplification, buffering, and distribution across an integrated circuit, collectively depicted by the distribution channel 28. Following end-point amplification at amplifier 30, the aggregation of duty-cycle errors results in a periodic RF signal that no longer exhibits a 50% duty cycle. An RF duty-cycle correction circuit 10 is thus placed in the path of the periodic RF signal, immediately prior to application to circuits for which an accurate duty-cycle is required, such as a power amplifier 16. In general, embodiments of the present invention may be placed at numerous locations in a circuit, as required to provide an accurate duty-cycle periodic RF signal precisely where needed for critical operations.

As depicted in FIGS. 1 and 2, the RF duty-cycle correction circuit 10 comprises a plurality of AC-coupled, independently-biased inverter stages connected in series. Each inverter stage comprises an inverter; an AC-coupling capacitor linking the inverter to either the circuit 10 input or the output of a prior inverter stage; and a feedback resistive element, such as a resistor, connecting the input and output of the inverter. In the embodiment depicted, the independently-biased inverter stages are self-biased.

Figure 3:
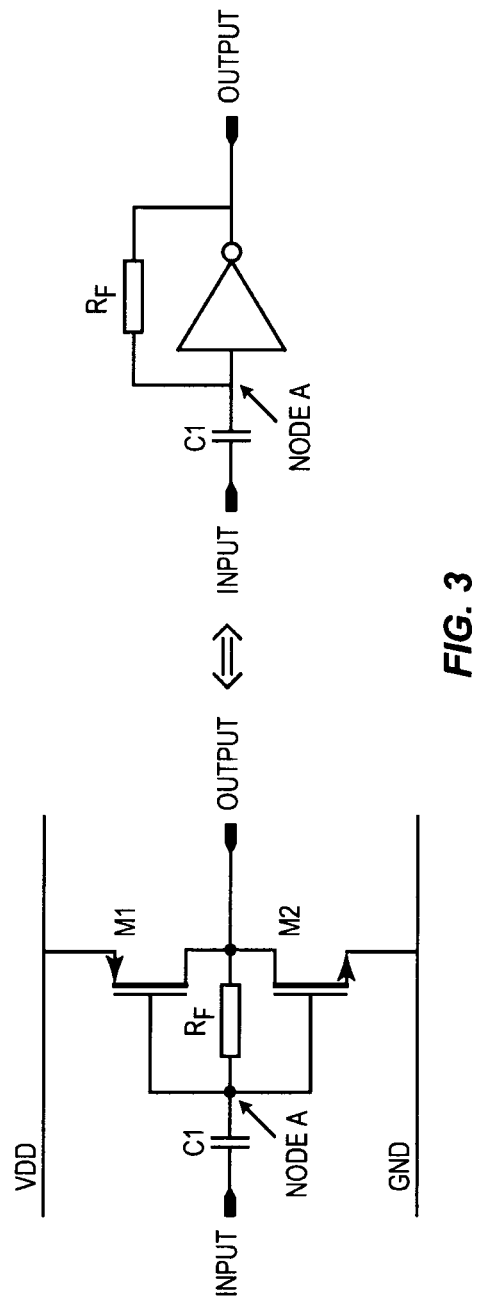
FIG. 3 depicts transistor- and circuit-level schematics of one stage of the duty-cycle correction circuit of FIG. 1.

These elements are depicted in greater detail in FIG. 3, depicting a transistor-level representation of a single inverter stage on the left side. The inverter stage comprises a conventional inverter (which may, for example, be implemented in CMOS as the conventional, stacked combination of MOSFETs M1 and M2). The input to the inverter is AC-coupled to an input signal (either the input to the RF duty-cycle correction circuit 10 for the first stage, or the output of a prior stage for successive stages) by a capacitor C1. As known in the art, over a finite frequency band, a capacitor sized for that frequency acts as a short-circuit to AC signals, and an open-circuit to DC. That is, the DC-bias of each inverter stage in the RF duty-cycle correction circuit 10 may be set independently of adjacent stages.

In particular, in one embodiment, the DC-bias level of the inverter input (the gates of M1 and M2), designated as "Node A" is FIG. 3, is determined by a high ohmic feedback element, such as resistor $R_F$, connected between Node A and the inverter output. Thus, in this embodiment, the inverter stage determines its own DC bias level. This structure is known in the art as "self-biased inverter," and is conventionally used, for example, as a small-signal amplifier, such as a Low Noise Amplifier (LNA). According to embodiments of the present invention, the self-biased inverter structure is not used as small-signal amplifier, but rather acts (in conjunction with other, AC-coupled stages) as a large-signal duty-cycle correction circuit. A schematic circuit representation is depicted on the right side of FIG. 3. As described further herein, in other embodiments, an inverter stage may be DC-biased in a manner other than self-biasing.

The duty-cycle correction mechanism of AC-coupled, self-biased inverter structure is based on a combination of three principles: averaging by using AC-coupling at the gate; non-zero rise and fall times of the periodic RF signal being duty-cycle corrected (i.e., the rising and falling signal transition edges have finite, non-zero positive and negative slope, respectively); and a self-biased inverter that defines its own state transition point. In embodiments of the present invention, the combination of these three mechanisms automatically applies incremental correction to the duty-cycle of an applied periodic RF signal. A plurality of such inverter stages connected in series results in successive incremental duty-cycle corrections, generating a periodic RF signal with a substantially 50% duty-cycle. The number N of inverter stages required for proper operation depends on the duty-cycle error of a periodic RF signal at the input, the signal rise and fall times relative to the signal period duration, and the desired accuracy of the duty-cycle at the output.

In general, an applied periodic RF signal may be brought to a 50% duty-cycle, within an arbitrarily small margin of error, by adjusting the number of serially-connected, AC-coupled, self-biased inverter stages in an RF duty-cycle correction circuit 10. An even number N of inverter stages will automatically cancel threshold variation-induced duty-cycle distortion, although an even number N is not a limitation of the present invention. The RF duty-cycle correction circuit 10 is insensitive to process variation or temperature changes, and hence does not require any feedback or calibration algorithm.

FIG. 4 depicts the representative operation of an RF duty-cycle correction circuit 10 by a graphic display of waveforms. In this example, the signal rise and fall times are exaggerated from a practical case (that is, the slope of the transitions is more gradual) so that the correction effect is more clearly visible. FIG. 4A depicts a 40% duty-cycle RF signal applied at the input; however, it should be clear that this is an example only, and the correction mechanism is the same for any other non-50% duty-cycle. The high state time is defined by the signal switching threshold voltage (or effective trip-point) which is, for an optimized inverter stage, half its supply voltage level (i.e., VDD/2 or 0.5*VDD). The average voltage level for this 40% duty-cycle signal is lower that the midpoint (La, 0.4*VDD), as indicated by the lower dashed line in FIG. 4A.

By AC-coupling the inverter to the input, as depicted by the capacitor in FIG. 3, a new equilibrium of the bias level occurs at "Node A," as depicted in FIG. 4B. The periodic RF signal now has a shifted DC bias level, or adjusted trip-point for the inverter, that is closer to the desired transition voltage level (~0.5*VDD). The high state time is increased, as indicated in FIG. 4B by the falling signal transition crossing the transition point later than in the case of FIG. 4A (the vertical dashed line in FIG. 4B is aligned with the original trip-point from FIG. 4A). The duty-cycle adjustment at each inverter stage is highly dependent on the periodic RF signal rise and fall times; as noted above, the slew rates are greatly exaggerated in FIG. 4 for demonstrative purposes.

In practice, duty-cycle correction is achieved incrementally, over N series-connected, AC-coupled, self-biased inverter stages. FIG. 4C depicts the periodic RF signal at or near the final inverter stage. Note that the average signal voltage level coincides with the transition voltage level (~0.5*VDD), and the high and low signal states each comprise half of the period duration T. A plurality of N inverter stages are required in practice, since the duty-cycle correction at each stage depends on the rise and fall times, and for good phase noise behavior these should stay low. By using an even number N of AC-coupled, self-biased inverter stages, any possible pull-up/pull-down asymmetry of the individual inverter stages is compensated. Also, obviously, an odd number N of inverter stages will result in an in inverted periodic RF signal (i.e., 180° out of phase with the input periodic RF signal). However, the number N of inverter stages being even is not a restriction or limitation of the present invention.

Figure 5:
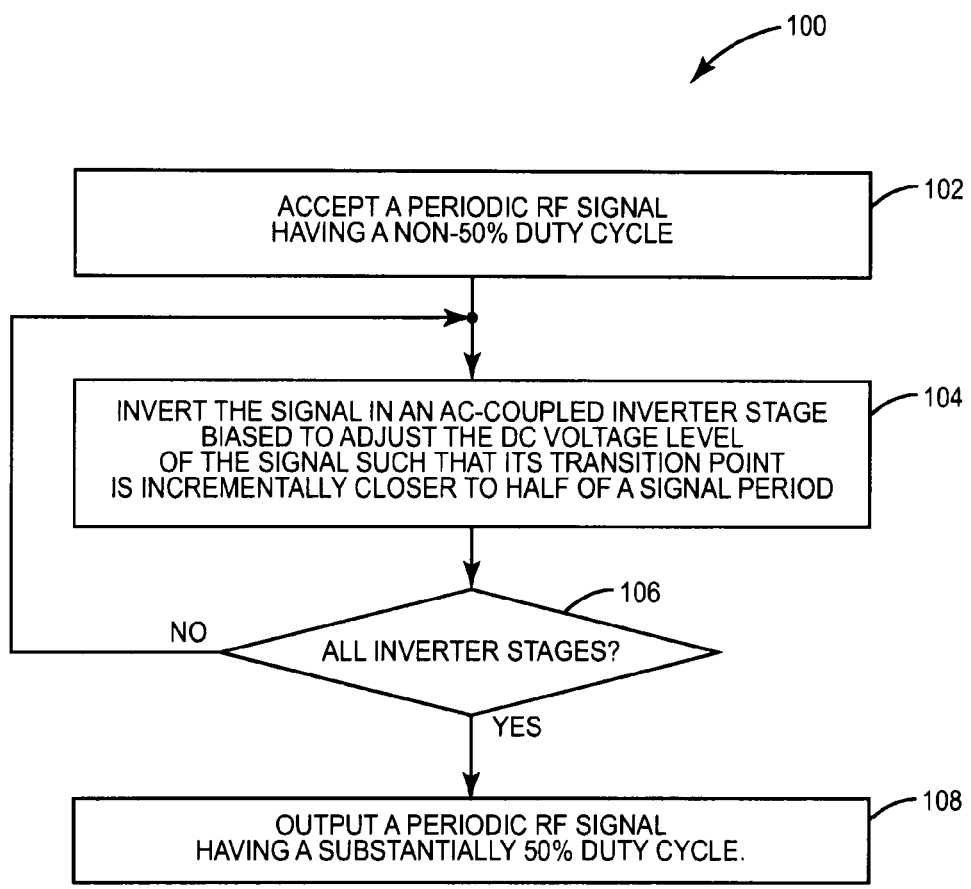
FIG. 5 is a flow diagram of a method of correcting the duty-cycle of a periodic signal.

FIG. 5 depicts a method 100 of correcting the duty-cycle of a periodic RF signal, by an RF duty-cycle correction circuit 10. The correction circuit 10 accepts a periodic RF signal having a non-50% duty-cycle at its input (block 102). The correction circuit 10 inverts the signal in a first AC-coupled inverter stage that is self-biased to adjust the DC voltage level of the periodic RF signal such that its transition point voltage, and hence the timing of the signal state change, is shifted incrementally closer to half of the period of the period RF signal (block 104). This action is repeated at successive AC-coupled, self-biased inverter stages of the correction circuit 10 (blocks 106, 104). When the periodic RF signal reaches the last AC-coupled, self-biased inverter stage (block 106), the RF duty-cycle correction circuit 10 outputs a periodic RF signal having a substantially 50% duty-cycle (block 108).

Figure 6:
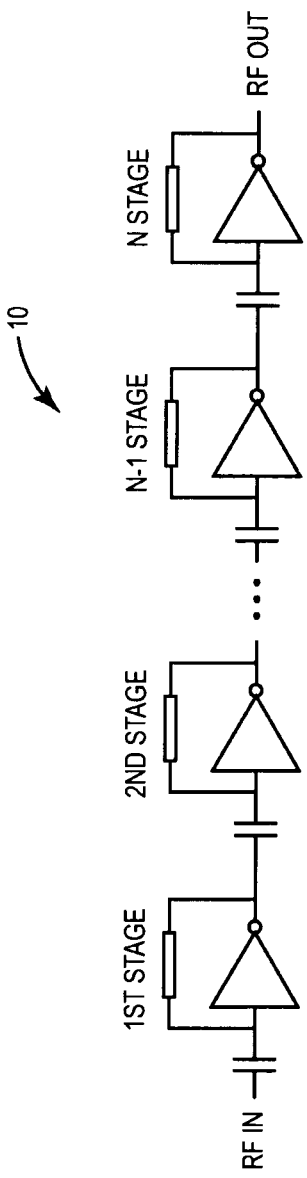
FIG. 6 is a circuit diagram depicting a plurality of stages of the duty-cycle correction circuit connected in series.
Figure 7:
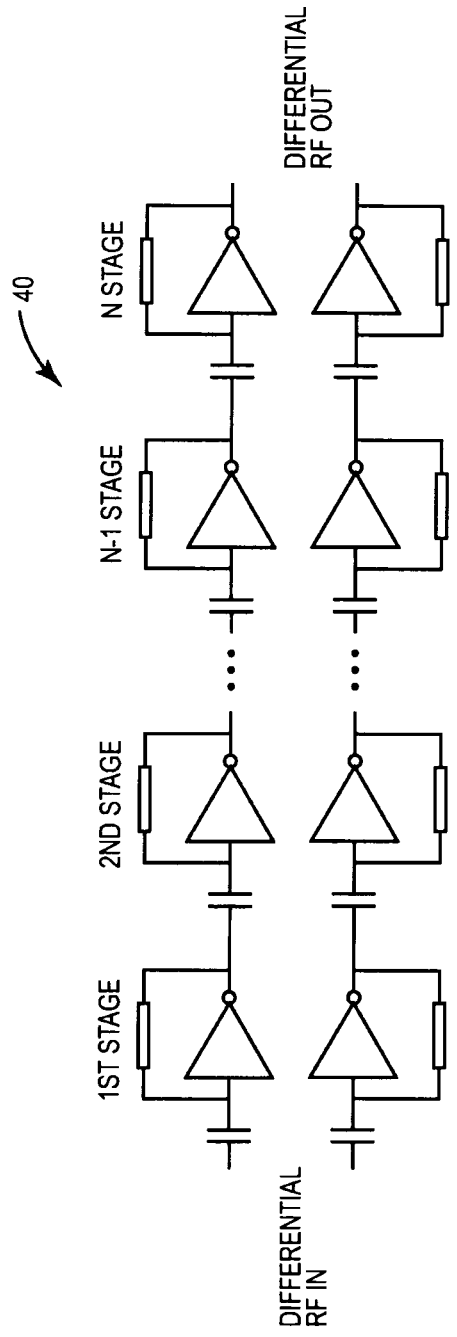
FIG. 7 is a circuit diagram depicting a plurality of stages of a balanced duty-cycle correction circuit.
Figure 8:
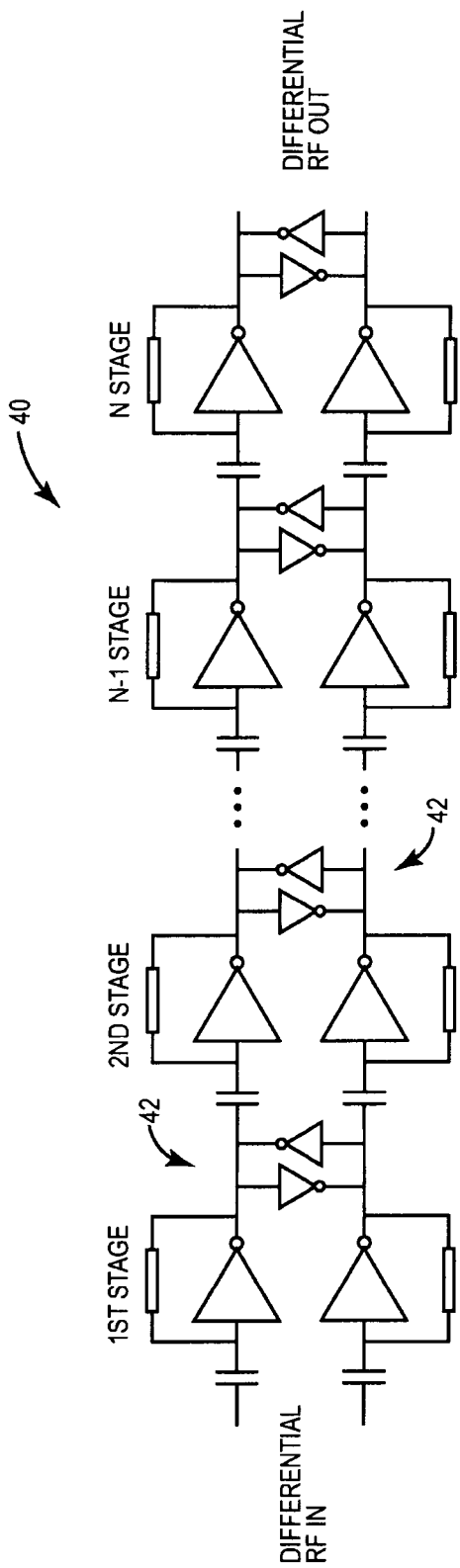
FIG. 8 is a circuit diagram of the balanced duty-cycle correction circuit of FIG. 7 with cross coupled inverters between parallel branches.

FIG. 6 depicts an RF duty-cycle correction circuit 10 according to an embodiment operative to correct the duty-cycle of a single-ended periodic RF signal—that is, a periodic RF signal that transitions periodically between supply voltage nodes (e.g., VDD and GND). FIG. 7 depicts an RF duty-cycle correction circuit 40 according to an embodiment operative to correct the duty-cycle of a differential periodic RF signal—that is, a periodic RF signal comprising positive and negative components, typically processed in complimentary, or mirrored, circuit paths. The differential RF duty-cycle correction circuit 40 comprises two matched pluralities of AC-coupled, self-biased inverter stages connected in series. FIG. 8 depicts an embodiment of the differential RF duty-cycle correction circuit 40 in which cross-coupled inverters 42 connect the two branches, or pluralities of AC-coupled, self-biased inverter stages, one pair of cross-coupled inverters 42 per balanced inverter stage. The cross-coupled inverters 42 preserve circuit balance (and hence maximum common-mode noise rejection) in the face of component mismatches between the branches.

Figure 9:
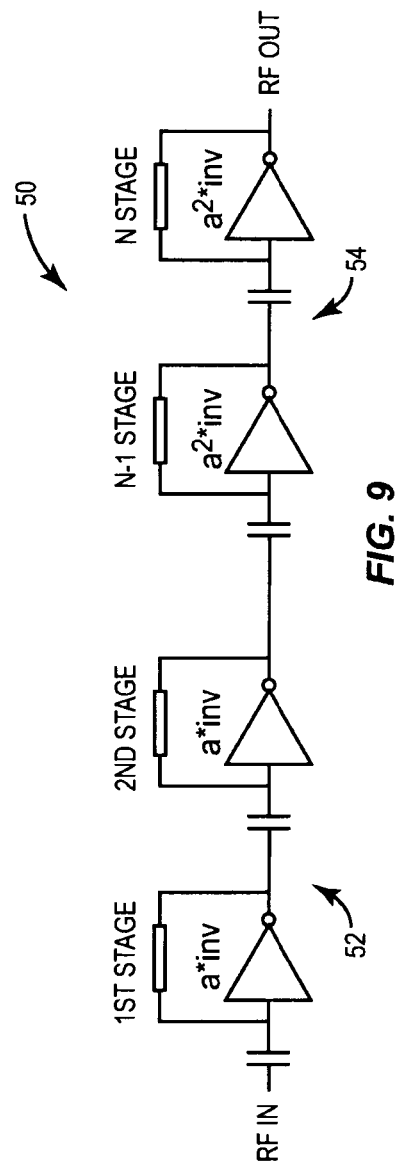
FIG. 9 is a circuit diagram of a duty-cycle correction circuit featuring drive strength scaling as well as duty-cycle correction.

FIG. 9 depicts an RF duty-cycle correction circuit 50 according to an embodiment in which drive strength scaling (i.e., fan-out), is combined with duty-cycle correction. The scaling is done by substituting higher drive strength inverters in the final stage(s) of the correction circuit 50. For example, the first two stages of the RF duty-cycle correction circuit 50 utilize inverters 52 of "a" size, or drive strength. The latter two stages utilize inverters 54 of size "$a^2$," yielding a higher drive strength, or fan-out, at the output of the RF duty-cycle correction circuit 50. In both cases, the capacitor and resistor are scaled appropriately. In the embodiment depicted in FIG. 9, only four stages are used (La, N=4), and the drive strength staggering is done in pairs (even number); however, this is not a restriction or limitation of the present invention, and in general numerous combinations of scaled components may be used, as required or desired for particular applications. The RF duty-cycle correction circuit 50 may be particularly useful, for example, when distributing a clock signal having a relatively large fan-out, where an accurate 50% duty-cycle of the clock is critical.

Figure 10:
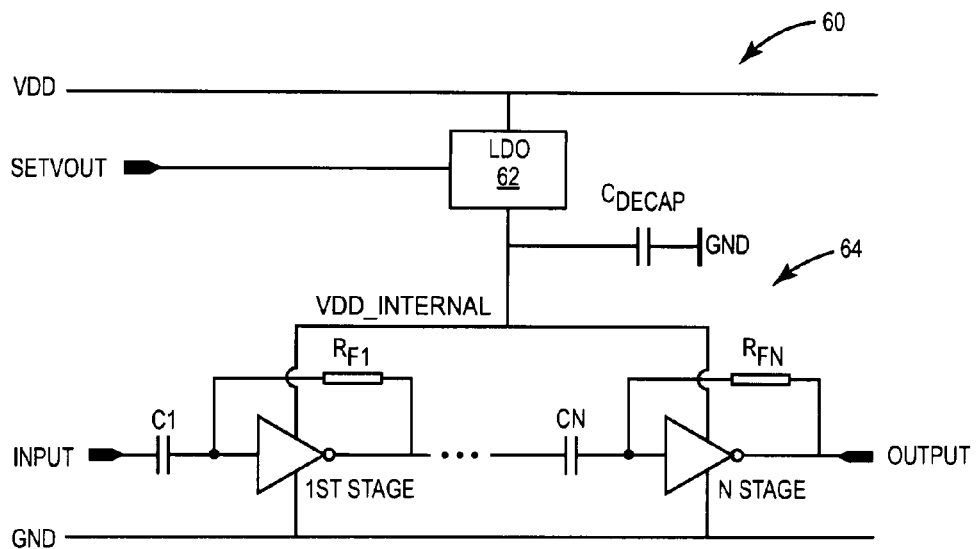
FIG. 10 is a circuit diagram of a duty-cycle correction circuit featuring voltage regulation and local decoupling on internal power supply.

Many modern electronic circuits include different logical and/or physical sections that operate at different supply voltage levels. For example, an analog circuit, such as a receiver front end, may operate at a different voltage than associated baseband digital circuits. As another example, in portable devices that operate on battery power, some integrated circuit chips, or even circuits on the same chip, may operate at a lower supply voltage than other circuits, to reduce power consumption. FIG. 10 depicts an RF duty-cycle correction environment 60 according to an embodiment in which the peak-to-peak voltage swing of a periodic RF signal being duty-cycle corrected may be set to any level below the supply voltage (e.g., VDD). A voltage regulator 62, such as a Low Drop Out (LDO) regulator, regulates the supply voltage VDD to a lower voltage, in response to an input SETVOUT. The RF duty-cycle correction circuit 60 then operates to correct the duty-cycle of a periodic RF signal to substantially 50%, within the voltage level set by the regulator 42. In addition to reducing the voltage swing of the periodic RF signal, the circuit 60 may improve signal quality by isolating the corrected periodic RF signal from noise on the VDD supply line, via the decoupling capacitor $C_{DECAP}$. The circuit 60 may be particularly suited to driving low-voltage digital circuits.

Figure 11:
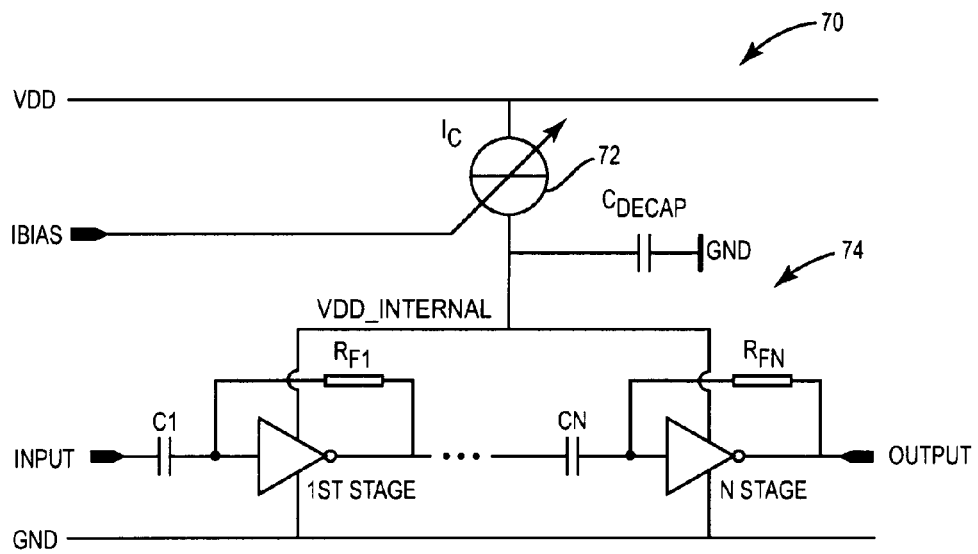
FIG. 11 is a circuit diagram of a duty-cycle correction circuit featuring a current source and local decoupling on internal power supply.

FIG. 11 depicts an RF duty-cycle correction environment 70 according to an embodiment particularly suited for driving RF analog circuits. The supply current to the RF duty-cycle correction circuit 74 is set by the IBIAS input to a variable current source 72. The decoupling capacitor $C_{DECAP}$ shunts high-frequency noise to GND. This embodiment not only reduces the effective supply voltage to the RF duty-cycle correction circuit 74, but additionally improves the quality of the duty-cycle corrected periodic RF signal by reducing phase noise and jitter.

Figure 12:
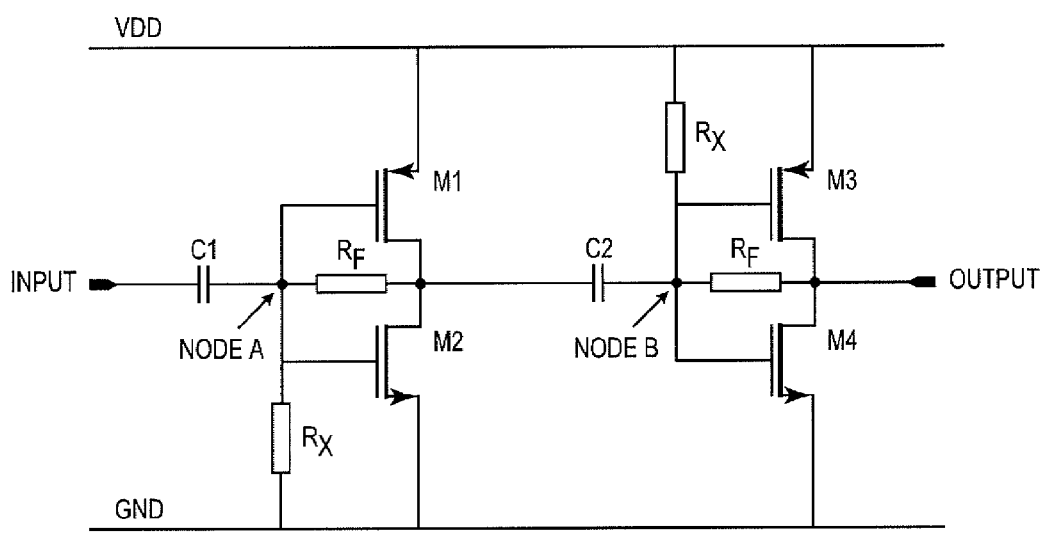
FIG. 12 is a circuit diagram of a duty-cycle correction circuit operative to correct a periodic signal to a non-50% duty-cycle.

The above descriptions have centered on embodiments operative to correct a periodic signal to substantially 50% duty-cycle, by using self-biased inverter stages. FIG. 12 depicts a representative pair of AC-coupled, independently-biased inverter stages connected in series and operative to correct the duty-cycle of an applied periodic signal to a value that may be other than 50%. In this embodiment, each of the AC-coupled, independently-biased inverter stages is biased by a divider network formed by the feedback resistor $R_F$ described above, and additionally a biasing resistor $R_X$ connected between the gate of each respective transistor pair (e.g., Node A and Node B in FIG. 12), and a power supply node. The biasing resistor $R_X$ of the two stages is connected to different power supply nodes due to the polarity change of the signal. In the case that the values of biasing resistor $R_X$ coupled to Node A and Node B are equal, the circuit corrects a periodic signal applied at the input towards a 50% duty-cycle. If the values of biasing resistor $R_X$ coupled to Node A and Node B are different (more precisely, the effective DC level of the gate nodes differ), the circuit corrects a periodic signal applied at the input towards a duty-cycle other than 50%. In practice, a duty-cycle correction circuit utilizing the AC-coupled, independently-biased inverter stages of FIG. 12 would cascade a plurality of such pairs of inverter stages, to achieve the desired level of duty-cycle correction.

Figure 13:
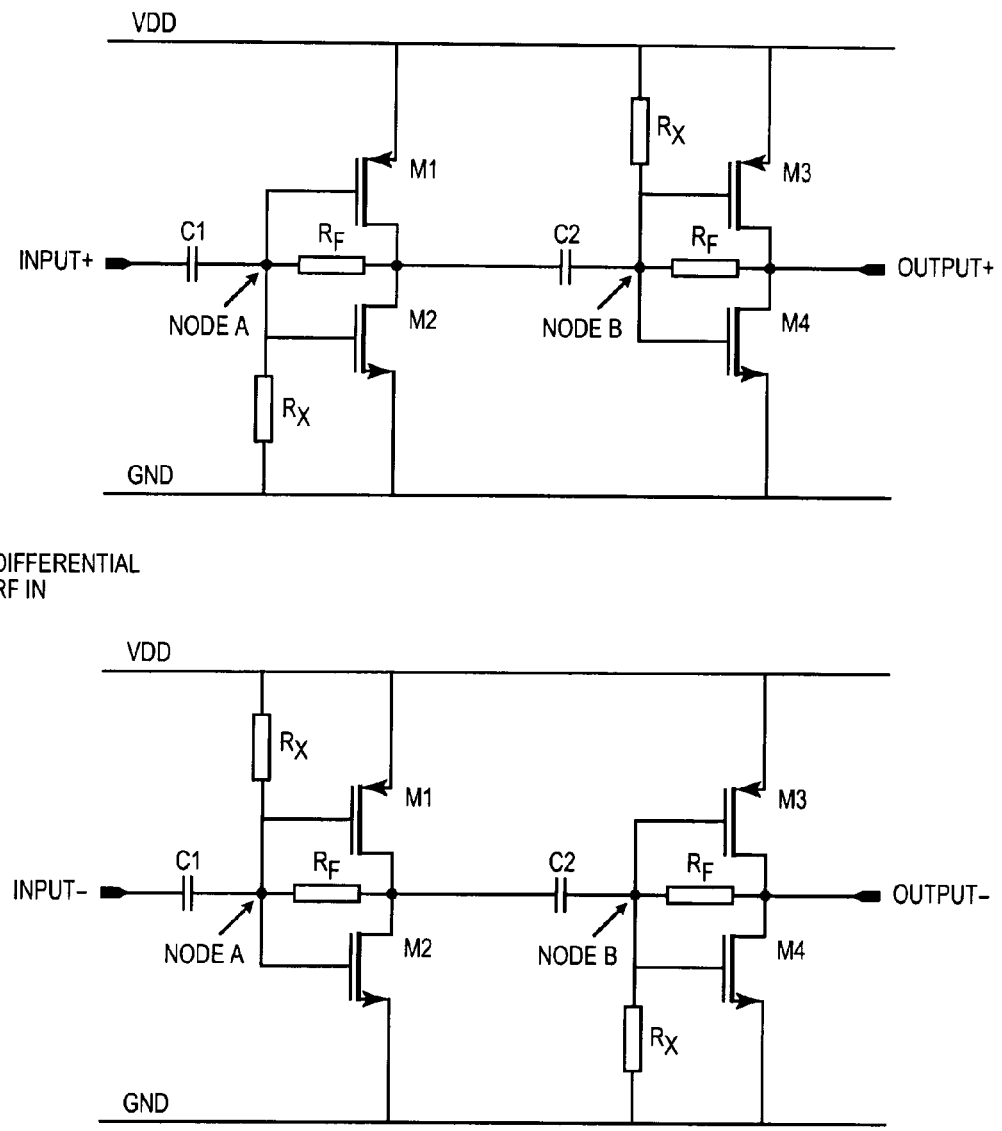
FIG. 13 is a circuit diagram of a duty-cycle correction circuit operative to correct a differential periodic signal to a complementary, non-50% duty-cycle.
Figure 14:
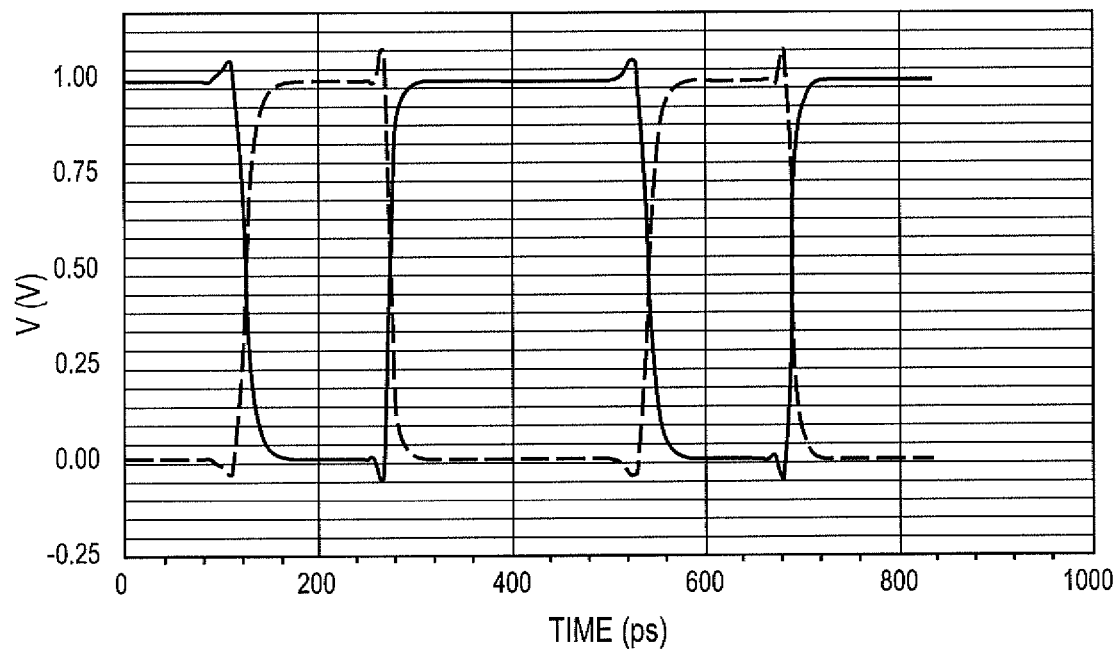
FIG. 14 is a graph of the output of the circuit of FIG. 13.

FIG. 13 depicts an embodiment wherein a differential periodic signal is corrected to a complementary, non-50% duty-cycle. The positive and negative components of the differential periodic signal are applied to the inputs of parallel pairs of AC-coupled, independently-biased inverter stages that are connected in series. At corresponding inverter stages in the parallel paths, the biasing resistor $R_X$ is connected to the opposite power supply node. This biases one component of the differential periodic signal, e.g., the positive component in the upper parallel path, to one duty-cycle, e.g., less than 50%, and in complementary fashion, biases the other input signal component, e.g., the negative component in the lower parallel path, to a corresponding opposite duty-cycle, e.g., less than 50%. FIG. 14 depicts the output waveforms of the complimentary, non-50% differential duty-cycle correction circuit of FIG. 13.

Figure 15:
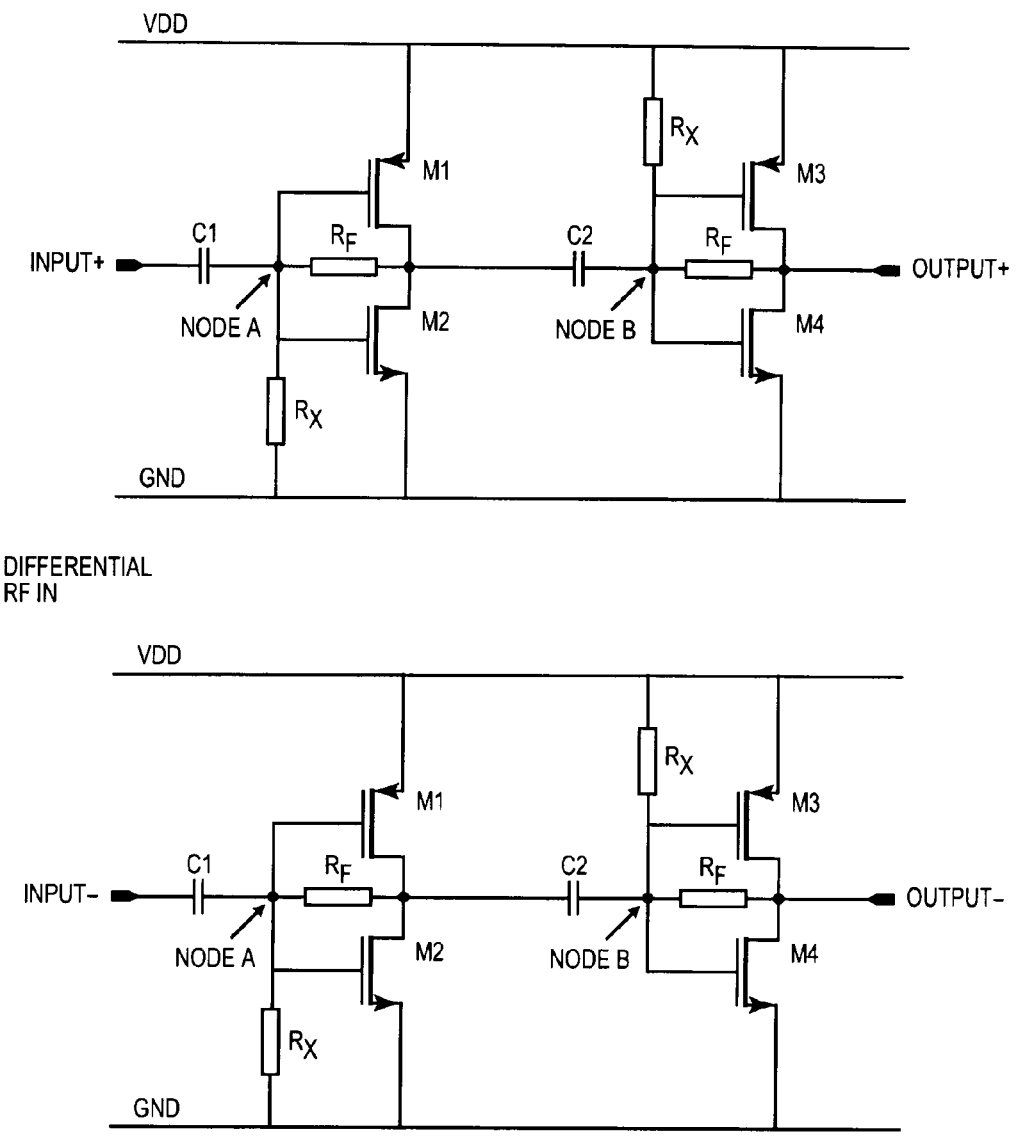
FIG. 15 is a circuit diagram of a duty-cycle correction circuit operative to correct a differential periodic signal to a balanced, non-50% duty-cycle.
Figure 16:
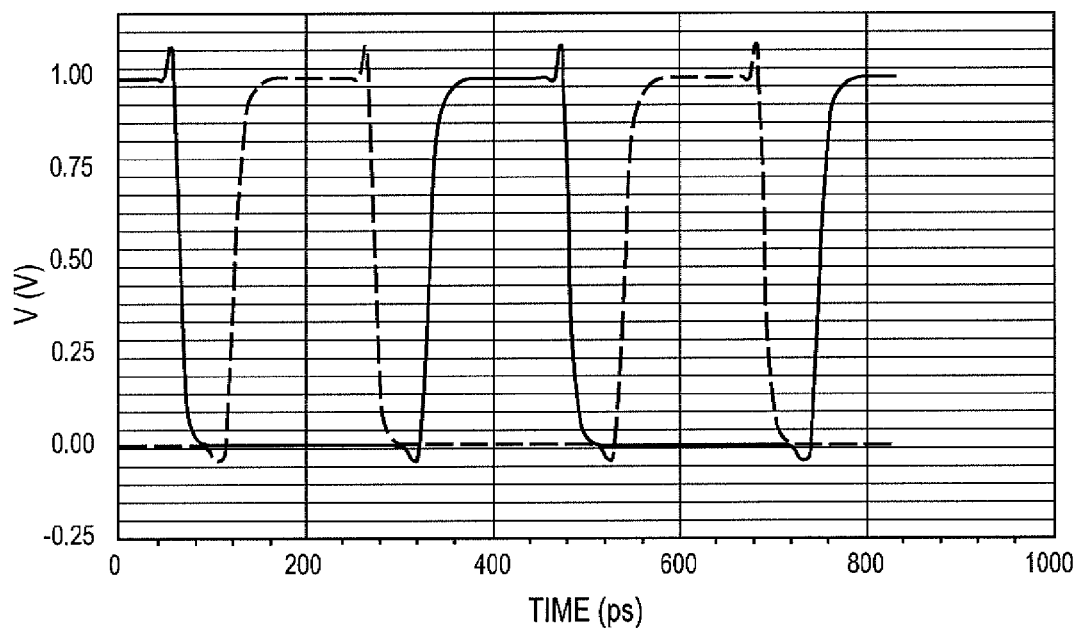
FIG. 16 is a graph of the output of the circuit of FIG. 15.

FIG. 15 depicts an embodiment wherein a differential periodic signal is corrected to a balanced, non-50% duty-cycle—that is, each of the positive and negative components of the differential periodic signal are corrected to the same duty-cycle value. In this embodiment, at corresponding inverter stages in the parallel paths, the biasing resistor $R_X$ is connected to the same power supply node. This biases both components of the differential periodic signal to the same duty-cycle. FIG. 16 depicts the output waveforms of the balanced, non-50% differential duty-cycle correction circuit of FIG. 15. In the embodiment depicted, the corrected duty-cycle is less than 50%. To correct a differential periodic signal to a balanced duty-cycle greater than 50%, the first AC-coupled, independently-biased inverter stage in each parallel path would have the biasing resistor $R_X$ connected to the VDD node, with the biasing resistor $R_X$ of the second inverter stage connected to GND.

Figure 17:
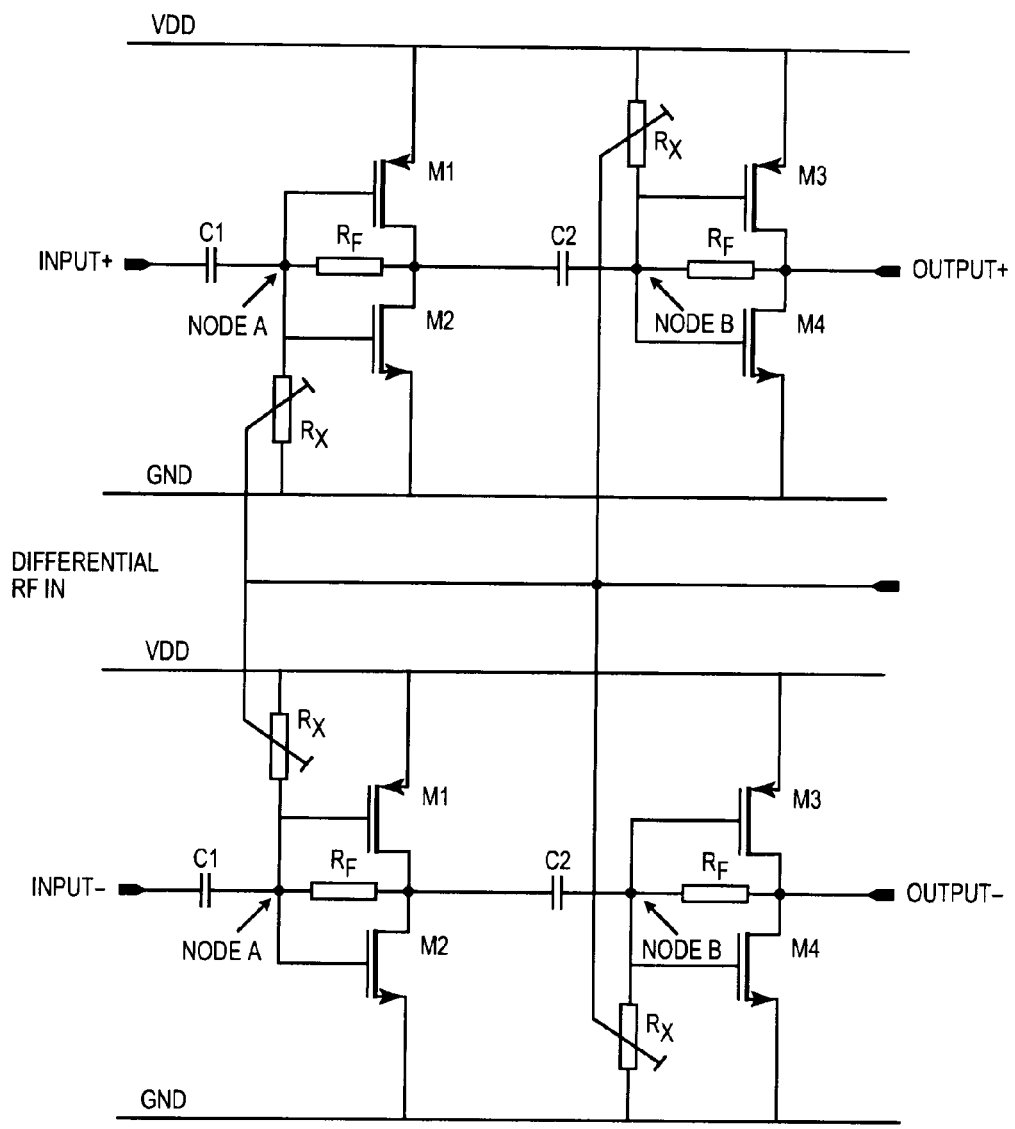
FIG. 17 is a circuit diagram of a duty-cycle correction circuit operative to correct a differential periodic signal to a variable duty-cycle.

FIG. 17 depicts an embodiment of a differential duty-cycle correction circuit featuring a variable, or controllable, duty-cycle. The duty-cycle is set by varying the values of the biasing resistors $R_X$ in each of the series-connected pair of AC-coupled, independently-biased inverter stages, in both parallel branches. This has the effect of altering the DC bias level of the gate nodes (e.g., Nodes A and B), resulting in an alteration of the duty-cycle, as described above. In this embodiment, any duty-cycle less than 50% may be achieved by selecting appropriate values of $R_X$ and $R_F$. To implement a variable, differential duty-cycle correction circuit to correct a differential periodic signal to a duty-cycle greater than 50%, the first AC-coupled, independently-biased inverter stage in each parallel path would have the biasing resistor $R_X$ connected to the VDD node, with $R_X$ of the second inverter stage of each pair connected to GND.

Those of skill in the art will readily recognize that any of the embodiments described herein may be combined as desired or required. For example, the high fan-out correction circuit 50 of FIG. 9, the voltage-regulated correction circuit 60 of FIG. 10, and/or the source current-controlled correction circuit 70 of FIG. 11 may be implemented using the balanced correction circuit 40 architecture depicted in FIG. 7, with or without the cross-coupled inverters 42 depicted in FIG. 8, to realize the advantages of the former innovations in balanced circuits. Furthermore, all 50% duty-cycle correction embodiments depicted herein may be implemented to achieve non-50% duty-cycle correction by considering the AC-coupled, independently-biased inverter stages in pairs, and adding a biasing resistor $R_X$ connected one power supply node in one inverter stages and the opposite power supply node in the other inverter stage.

Embodiments of the present invention present numerous advantages over prior art duty-cycle correction circuits. They are useful and practical for RF signals, including those with small capacitance. RF duty-cycle correction circuits described herein may be utilized to correct a wide range of duty-cycle errors (e.g., 20%-80%). By using an even number of stages in series, RF duty-cycle correction circuits according to embodiments of the present invention exhibit insensitivity to process, mismatch, or temperature changes. They eliminate the need for calibration circuits or correction loops, conserving silicon area and reducing power consumption. RF duty-cycle correction circuits according to embodiments described herein exhibit very good phase noise behavior, and may easily be adapted to form balanced structures without being sensitive to mismatch. The RF duty-cycle correction circuit can also be used to scale up the drive strength, or fan-out, of a periodic RF signal. Finally, the RF duty-cycle correction circuits described herein may be operated at reduced voltage and power levels, by means of a LDO or controlled current source and to decouple the periodic RF signal from voltage supply line noise.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A duty-cycle correction circuit comprising:
    a first plurality of AC-coupled, independently-biased inverter stages connected in series between an input operative to receive a periodic signal and an output operative to generate a periodic signal having a 50% duty-cycle, said first plurality of AC-coupled, self-biased inverter stages comprising an even number of inverter stages operative to compensate for pull-up and pull-down asymmetries of the individual inverter stages;
    wherein each AC-coupled, independently-biased inverter stage comprises:
        an inverter having input and output nodes;
        an AC coupling component connected in series between the stage input and the input node of the inverter; and
        a first resistive element connected between the input and output nodes of the inverter.

2. The circuit of claim 1 wherein the AC coupling component comprises a capacitor.

3. The circuit of claim 1 wherein the first resistive element comprises a high ohmic resistor.

4. The circuit of claim 1 further comprising a second plurality of AC-coupled, independently-biased inverter stages connected in series, the second plurality having the same number of inverter stages as the first plurality, and arranged in parallel with the first plurality of inverter stages, the first and second plurality comprising a balanced duty-cycle correction circuit operative to correct a differential periodic signal having positive and negative signal components to a duty-cycle dependent on the biases of the inverter stages.

5. The circuit of claim 4 further comprising one or more pair of cross-coupled inverters connecting the first and second plurality of inverter stages.

6. The circuit of claim 1 wherein the inverter in one or more successive inverter stages in the first plurality has a greater drive strength than the inverter in one or more preceding inverter stages.

7. The circuit of claim 1 further comprising VDD and GND nodes, and a voltage regulator connected to the VDD node, and wherein the inverter in each AC-coupled, independently-biased inverter stage in the duty-cycle correction circuit is connected between GND and a regulated voltage lower than VDD.

8. The circuit of claim 1 further comprising VDD and GND nodes, and a current source connected to the VDD node, and wherein the inverter in each AC-coupled, independently-biased inverter stage in the first plurality is connected between GND and the current source, such that the current source controls the current drawn by the duty-cycle correction circuit.

9. The circuit of claim 1, wherein
    the plurality of AC-coupled, independently-biased inverter stages comprises a plurality of series-connected pairs of AC-coupled, independently-biased inverter stages;
    each AC-coupled, independently-biased inverter stage further comprises a second resistive element connected between the input node of the inverter and a power supply node; and
    within each pair of AC-coupled, independently-biased inverter stages, the second resistive element in the first inverter stage of the pair is connect to one power supply node, and the second resistive element in the second inverter stage of each pair is connected to the other power supply node.

10. The circuit of claim 9 further comprising a second plurality of series-connected pairs of AC-coupled, independently-biased inverter stages connected in series, the second plurality having the same number of pairs of inverter stages as the first plurality, and arranged in parallel with the first plurality of pairs of inverter stages, the first and second plurality comprising a duty-cycle correction circuit operative to correct a differential periodic signal having positive and negative signal components to a duty-cycle dependent on the bias of the inverter stages.

11. The circuit of claim 10 wherein, for corresponding pairs of AC-coupled, independently-biased inverter stages in the parallel pluralities of pairs of inverter stages, the second resistive element is connected to opposite power supply nodes in the first inverter stage of the pair.

12. The circuit of claim 10 wherein, for corresponding pairs of AC-coupled, independently-biased inverter stages in the parallel pluralities of pairs of inverter stages, the second resistive element is connected to the same power supply node in the first inverter stage of the pair.

13. A method of correcting the duty-cycle of a periodic signal, comprising:
    accepting a periodic signal having a positive component and a negative component;
    successively inverting the signal in a plurality of balanced, parallel-connected pairs of AC-coupled inverter stages, each independently biased to adjust the DC voltage level of the signal such that its transition point is incrementally closer to a predetermined fraction of a signal period;
    wherein each balanced pair of AC-coupled inverter stages are connected by a pair of cross-coupled inverters to correct misalignments in the balancing due to mismatches between components in the balanced pair of AC-coupled inverter stages; and
    outputting a periodic signal having a duty-cycle dependent on the bias of the inverter stages.

14. The method of claim 13 wherein the periodic signal comprises positive and negative components, and wherein each AC-coupled inverter stage comprises a balanced, parallel-connected pair of AC-coupled inverter stages.

15. The method of claim 14 further comprising correct misalignments in the balancing due to mismatches between components in a balanced pair of AC-coupled inverter stages by connecting the balanced pair of AC-coupled inverter stages with a pair of cross-coupled inverters.

16. The method of claim 13 further comprising increasing the drive strength of the periodic signal by successively inverting the signal in one or more later AC-coupled inverter stages having a higher drive strength than one or more prior AC-coupled inverter stages.

17. The method of claim 13 further comprising outputting the periodic signal having a corrected duty-cycle at a regulated voltage lower than a supply voltage.

18. A duty-cycle correction circuit comprising:
a first plurality of AC-coupled, independently-biased inverter stages connected in series between an input operative to receive a periodic signal and an output operative to generate a periodic signal having a duty-cycle dependent on the biases of the inverter stages;
a second plurality of AC-coupled, independently-biased inverter stages connected in series, the second plurality having the same number of inverter stages as the first plurality, and arranged in parallel with the first plurality of inverter stages,
one or more pair of cross-coupled inverters connecting the first and second plurality of inverter stages;
wherein each AC-coupled, independently-biased inverter stage in said first and second plurality of AC-coupled inverter stages comprises:
an inverter having input and output nodes;
an AC coupling component connected in series between the stage input and the input node of the inverter; and
a first resistive element connected between the input and output nodes of the inverter;
wherein the first and second plurality of AC-coupled inverter stages form a balanced duty-cycle correction circuit operative to correct a differential periodic signal having positive and negative signal components to a duty-cycle dependent on the biases of the inverter stages.

19. The circuit of claim 18 wherein the cross-coupled inverters are operative to correct misalignments in the balancing due to mismatches between the first and second plurality of inverter stages.

20. A duty-cycle correction circuit comprising:
a first plurality of AC-coupled, independently-biased inverter stages connected in series between an input operative to receive a periodic signal and an output operative to generate a periodic signal having a duty-cycle dependent on the biases of the inverter stages;
wherein the inverter in one or more successive inverter stages in the first plurality has a greater drive strength than the inverter in one or more preceding inverter stages; and
wherein each AC-coupled, independently-biased inverter stage comprises:
an inverter having input and output nodes;
an AC coupling component connected in series between the stage input and the input node of the inverter; and
a first resistive element connected between the input and output nodes of the inverter.

21. A duty-cycle correction circuit comprising:
a VDD node;
a GND node;
a voltage regulator connected to the VDD node;
a first plurality of AC-coupled, independently-biased inverter stages connected in series between an input operative to receive a periodic signal and an output operative to generate a periodic signal having a duty-cycle dependent on the biases of the inverter stages;
wherein each AC-coupled, independently-biased inverter stage comprises:
an inverter having input and output nodes connected between the GND node and a regulated voltage lower than VDD;
an AC coupling component connected in series between the stage input and the input node of the inverter; and
a first resistive element connected between the input and output nodes of the inverter.

22. A duty-cycle correction circuit comprising:
a VDD node;
a GND node;
a current source connected to the VDD node;
a first plurality of AC-coupled, independently-biased inverter stages connected in series between an input operative to receive a periodic signal and an output operative to generate a periodic signal having a duty-cycle dependent on the biases of the inverter stages;
wherein each AC-coupled, independently-biased inverter stage comprises:
an inverter having input and output nodes connected between the GND node and the current source such that the current source controls the current drawn by the duty-cycle correction circuit;
an AC coupling component connected in series between the stage input and the input node of the inverter; and
a first resistive element connected between the input and output nodes of the inverter.

23. A duty-cycle correction circuit comprising:
a first plurality of AC-coupled, independently-biased inverter stages connected in series between an input and an output, the first plurality of AC-coupled, independently-biased inverter stages comprising a plurality of pairs of AC-coupled, independently biased inverter stages; and
a second plurality of AC-coupled, independently-biased inverter stages connected in series between the input and the output, the second plurality of AC-coupled, independently-biased inverter stages comprising the same number of pairs of AC-coupled, independently biased inverter stages as the first plurality;
wherein the first and second plurality of AC-coupled, independently biased inverter stages are configured to receive at said input a differential periodic signal having positive and negative signal components and to generate at said output a differential periodic signal having positive and negative signal components with a corrected duty-cycle dependent on the biases of the inverter stages;
wherein each AC-coupled, independently-biased inverter stage comprises:
an inverter having input and output nodes;
an AC coupling component connected in series between the stage input and the input node of the inverter; and
a first resistive element connected between the input and output nodes of the inverter; and
a second resistive element connected between the input node of the inverter and a power supply node; and
wherein the second resistive element in the first inverter stage of each pair of inverter stages is connected to one power supply node, and the second resistive element in the second inverter stage of each pair is connected to another power supply node; and
wherein the second resistive element in the first inverter stage of the first plurality is connected to one power supply node and the second resistive element in the second plurality is connected to another power supply node.

24. A duty-cycle correction circuit comprising:
a first plurality of AC-coupled, independently-biased inverter stages connected in series between an input and an output, the first plurality of AC-coupled, independently-biased inverter stages comprising a plurality of pairs of AC-coupled, independently biased inverter stages; and a second plurality of AC-coupled, independently-biased inverter stages connected in series between the input and the output, the second plurality of AC-coupled, independently-biased inverter stages comprising the same number of pairs of AC-coupled, independently biased inverter stages as the first plurality;

wherein the first and second plurality of AC-coupled, independently biased inverter stages are configured to receive at said input a differential periodic signal having positive and negative signal components and to generate at said output a differential periodic signal having positive and negative signal components with a corrected duty-cycle dependent on the biases of the inverter stages;

wherein each AC-coupled, independently-biased inverter stage comprises:
   an inverter having input and output nodes;
   an AC coupling component connected in series between the stage input and the input node of the inverter; and
   a first resistive element connected between the input and output nodes of the inverter; and
   a second resistive element connected between the input node of the inverter and a power supply node; and wherein the second resistive element in the first inverter stage of each pair of inverter stages is connected to one power supply node, and the second resistive element in the second inverter stage of each pair is connected to another power supply node; and wherein the second resistive element in the first inverter stage of the first plurality is connected to one power supply node and the second resistive element in the second plurality is connected to the same power supply node.

25. A method of correcting the duty-cycle of a periodic signal, comprising:
   accepting a periodic signal;
   successively inverting the signal in a plurality of AC-coupled inverter stages, each independently biased to adjust the DC voltage level of the signal such that its transition point is incrementally closer to a predetermined fraction of a signal period; and
   increasing the drive strength of the periodic signal by successively inverting the signal in one or more later AC-coupled inverter stages having a higher drive strength than one or more prior AC-coupled inverter stages; and
   outputting a periodic signal having a duty-cycle dependent on the bias of the inverter stages.

26. A method of correcting the duty-cycle of a periodic signal, comprising:
   accepting a periodic signal;
   successively inverting the signal in a plurality of AC-coupled inverter stages, each independently biased to adjust the DC voltage level of the signal such that its transition point is incrementally closer to a predetermined fraction of a signal period; and
   outputting a periodic signal having a duty-cycle dependent on the bias of the inverter stages at a regulated voltage lower than a supply voltage.

* * * * *